(12) United States Patent
Nakamura et al.

(10) Patent No.: US 6,233,492 B1
(45) Date of Patent: May 15, 2001

(54) PROCESS CONTROL SYSTEM AND METHOD FOR TRANSFERRING PROCESS DATA THEREFOR

(75) Inventors: Tsuyoshi Nakamura, Tama; Satoshi Tochiori, Kawagoe, both of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/065,720

(22) Filed: Apr. 24, 1998

(30) Foreign Application Priority Data

May 2, 1997 (JP) .................................................. 9-114649

(51) Int. Cl.[7] .................................................. G05B 19/18
(52) U.S. Cl. .............................. 700/2; 711/113; 711/118; 711/124; 711/144; 710/131; 710/129; 712/41; 712/205; 712/215; 712/226
(58) Field of Search ........................... 700/2; 711/113, 711/118, 124, 119, 144; 712/41, 205, 215, 226; 710/131, 129, 22; 395/842, 846

(56) References Cited

U.S. PATENT DOCUMENTS

| | | |
|---|---|---|
| 4,932,826 * | 6/1990 | Moy et al. ............................ 414/277 |
| 4,945,429 * | 7/1990 | Munro et al. ............................... 1/11 |
| 5,508,857 * | 4/1996 | Horita ..................................... 360/75 |
| 5,579,507 * | 11/1996 | Hosouchi et al. . |
| 5,831,851 * | 11/1998 | Eastburn et al. ................. 364/468.21 |
| 5,917,723 * | 6/1999 | Binford ................................ 364/131 |
| 5,920,480 * | 7/1999 | Nakamura et al. ............. 364/468.21 |
| 5,946,708 * | 8/1999 | Fang et al. ........................... 711/113 |

* cited by examiner

Primary Examiner—Ayaz R. Sheikh
Assistant Examiner—Firmin Backer
(74) Attorney, Agent, or Firm—Oblon, Spivak, McClelland, Maier & Neustadt, P.C.

(57) ABSTRACT

A process control system includes a plurality of machine controllers for individually controlling a plurality of process chambers and a main controller for controlling the machine controllers. Each of the machine controllers has a function of transferring process data detected by its corresponding process chamber to the main controller. The main controller has a storage device for accumulating process data transferred from the machine controllers and a function of transferring the accumulated process data to a host computer when the main controller is in a predetermined control load state.

17 Claims, 6 Drawing Sheets

PROCESS CONTROL SYSTEM AND METHOD FOR TRANSFERRING PROCESS DATA THEREFOR

BACKGROUND OF THE INVENTION

1. Field of the Invention

The present invention relates to a process control system for controlling, for example, a complex process type semiconductor wafer processing apparatus, and a method for transferring process data for the process control system.

2. Discussion of the Background

Recently a substrate processing apparatus such as a semiconductor wafer processing apparatus and a liquid crystal panel processing apparatus has remarkably tended to be automated and robotized in accordance with an improvement in performance of microcomputers. For example, various types of complex process type processing apparatuses have been developed, in which the chambers of respective processes are coupled to each other by means of a transfer unit or a robot thereby to automate a process from transfer of wafers or the like to reception thereof into the apparatus. In such an apparatus, various conditions (temperature, concentration, pressure, time, etc.) in a process are monitored by different sensors provided in each of the process chambers, and data of the monitored conditions (process data) is transferred and accumulated in a host computer. If the process data is made visible by a monitor and detected automatically, the optimum process conditions of mass-production line are set and controlled.

As the number of chambers synthesized with the semiconductor wafer processing apparatus and liquid crystal panel processing apparatus is increased, the control load of a controller (hereinafter referred to as a main controller) for unifying a group of machine controllers for separately controlling the chambers is increased more and more. The main controller transfers the process data to the host computer at the request of the host computer. The amount of process data to be transferred to the host computer increases in accordance with the number of process chambers and accordingly the control load tends to increase.

If, under the above circumstances, a process data transmission request is generated from the host computer during the execution of a process and both the process control and process data transfer control occur on the time basis at the same time, the control load of the main controller is greatly increased and the timing of the process control is delayed, with the result that it is likely that the whole process control will be made unstable.

BRIEF SUMMARY OF THE INVENTION

It is accordingly an object of the present invention to provide a process control system capable of improving in operation reliability by averaging a control load of a control apparatus on a time basis, for controlling a sequence of processes and transferring process data to a host computer in a complex process type processing apparatus, and a method for transferring process data for the process control system.

According to an aspect of the present invention, there is provided a process control system comprising a plurality of first controllers for individually controlling a plurality of process chambers, and a second controller for controlling the plurality of first controllers, the first controllers each having a function for transferring process data detected by a corresponding process chamber to the second controller, and the second controller including a function for accumulating process data transferred from the first controllers and a function for transferring the accumulated process data to an outside when the second controller is in a predetermined control load state.

According to another aspect of the present invention, there is provided a method of transferring process data, which comprises individually controlling a plurality of process chambers by a plurality of first controllers, controlling the first controllers by the second controller, transferring process data detected by the process chambers to the second controller, accumulating the transferred process data in storage means, and transferring the accumulated process data to an outside when the second controller is in a predetermined control load state.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinbefore.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention, in which.

DETAILED DESCRIPTION OF THE INVENTION

Embodiments of the present invention will now be described with reference to the accompanying drawings.

A process control system according to a first embodiment of the present invention is applied to, for example, a complex process type semiconductor wafer processing apparatus as described below.

Figure 1:
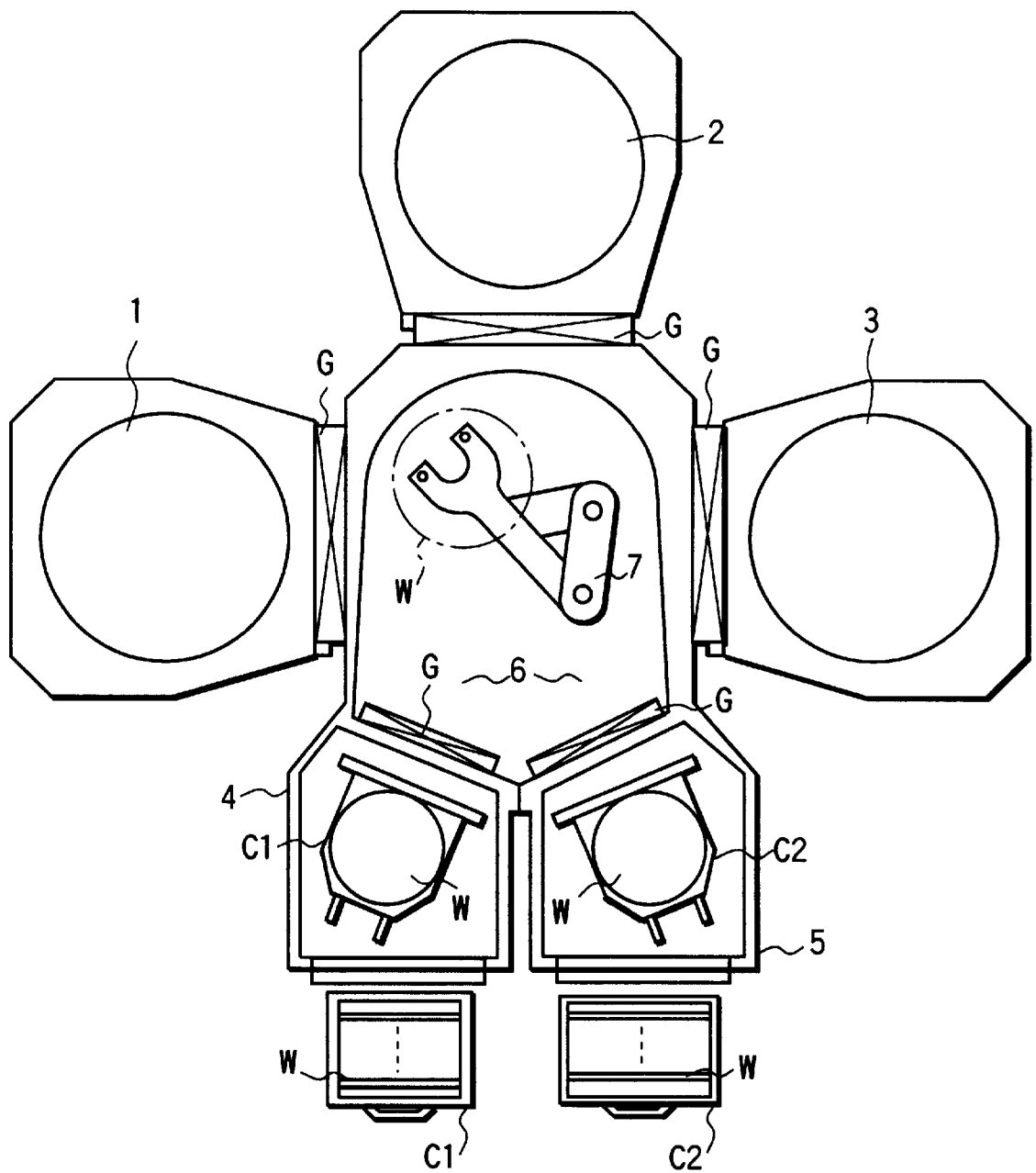
FIG. 1 is a view of the constitution of a complex process type semiconductor wafer processing apparatus to which a process control system according to an embodiment of the present invention can be applied.

As illustrated in FIG. 1, the semiconductor wafer processing apparatus includes a plurality of (e.g., three) process chambers 1, 2 and 3 for subjecting various processes, such as a CVD (chemical vapor deposition) process or a sputtering process, an etching process and a thermal oxidation process, to a semiconductor wafer, cassette chambers 4 and 5 having their respective cassettes C1 and C2 for holding a number of (e.g., twenty-five) wafers W, and a transfer chamber 6 for transferring the wafers W between the process chambers 1, 2 and 3 and the cassette chambers 4 and 5. The chambers are coupled to each other by means of a gate valve G such that the gate valve can freely be opened and closed. The transfer chamber 6 includes a multi-joint type transfer arm 7 which can be bent and rotated. This transfer arm 7 allows the wafers W to be transferred between the chambers. When the cassettes C1 and C2 are taken in the cassette chambers 4 and 5, they are reversed 90 degrees and the wafer insertion/removal opening of the cassettes C1 and C2 are rotated so as to face the center of the transfer chamber 6, with the result that the wafers W are positioned so as to be taken in and out by the transfer arm 7.

Figure 2:
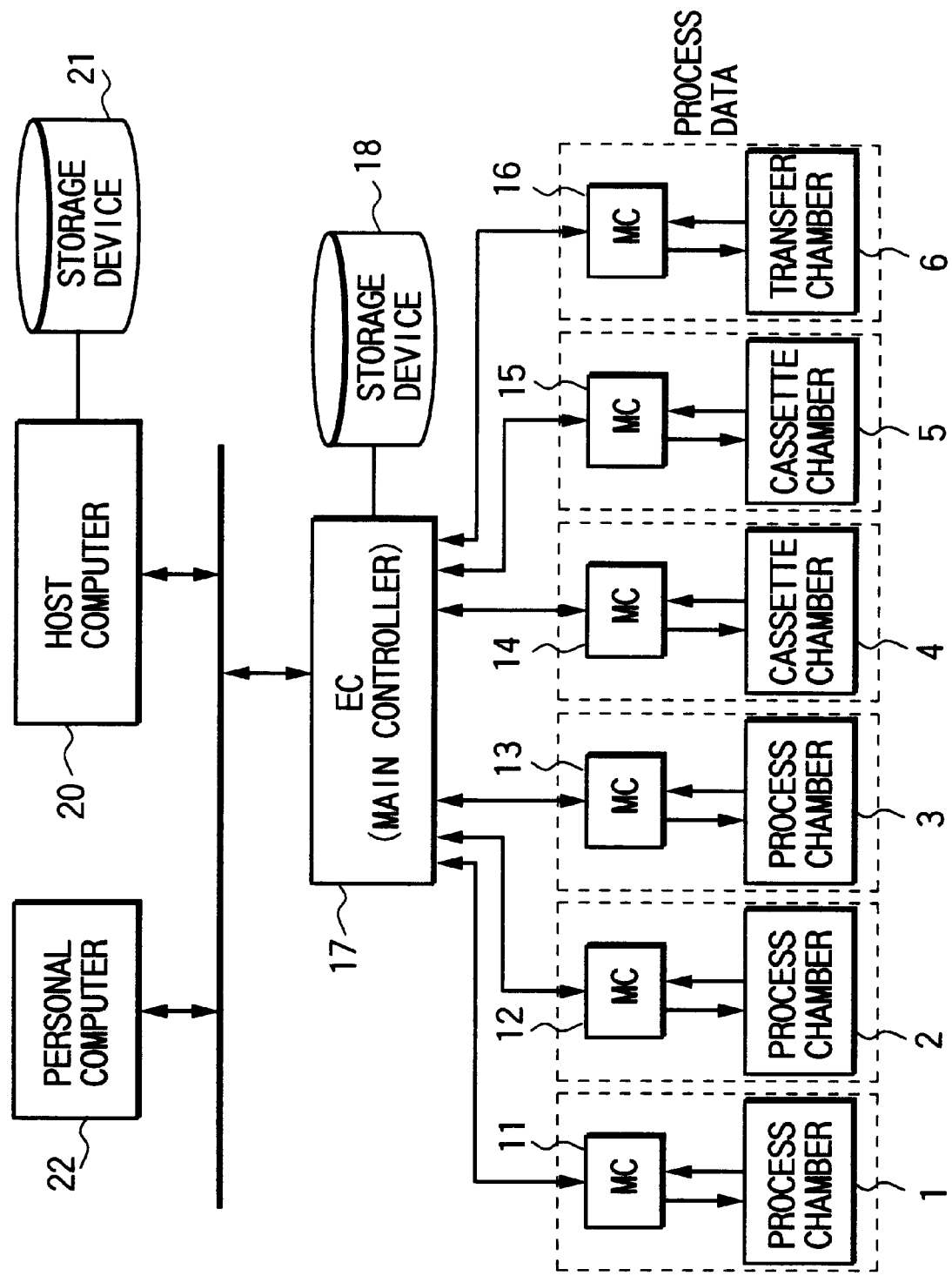
FIG. 2 is a block diagram of the constitution of the process control system according to the embodiment of the present invention.

FIG. 2 is a view of the constitution of a process control system for controlling the above-described complex process type semiconductor wafer processing apparatus.

Referring to FIG. 2, machine controllers (MC) 11 to 16 are provided to control their respective process chambers 1 to 3, cassette chambers 4 and 5, and transfer chamber 6 shown in FIG. 1. The machine controllers are controlled together by a main controller (EC) 17 as a master controller in accordance with a predetermined program and a process parameter such as a recipe parameter. The main controller 17 controls the procedure and timing of transfer of wafers W among the chambers and the process conditions (temperature, concentration, pressure, time, etc.) through the machine controllers 11 to 16. That is, the main controller 17 controls a series of processes in response to an instruction from a host computer 20.

Each of the process chambers 1 to 3 includes various types of sensors (not shown) for sensing the states of process, and the outputs of the sensors are transferred in sequence to the main controller 17 as process data in real time through their corresponding machine controllers 11 to 13. The main controller 17 receives the process data transferred by the machine controller 11 to 13 and accumulates it in a storage device 18 such as a hard disk.

When the main controller 17 is set in a predetermined control load state, the process data is transferred from the storage device 18 to the host computer 20 and accumulated in an external storage device 21 such as a hard disk connected to the host computer 20. The update process data is displayed on the monitor of the personal computer 22. The host computer 20 evaluates the process data accumulated in the external storage device 21 in accordance with given evaluation standards and transmits the parameter for optimizing the process conditions based on results of the evaluation, to the main controller 17 as a control command. In response to the control command, the main controller 17 supplies control commands for controlling the process conditions (temperature, concentration, pressure, time, etc.) to the machine controllers 11 to 16.

More specifically, the host computer 20 sends, for example, recipe parameters for executing a series of processes to the main controller 17, and the main controller 17 sets the process conditions (temperature, concentration, pressure, time, etc.) to the machine controllers 11 to 16 in accordance with the recipe parameters. The machine controllers 11 to 16 control the process chambers 1 to 6 under the process conditions corresponding to the recipe parameters. The signals sensed by the sensors provided in the process chambers 1 to 3 are sequentially transferred as actual data to the main controller 17 in real time through the corresponding machine controllers 11 to 13. The actual data is stored once in the storage device 18 and transferred to the host computer 20 when the main controller 17 is set in a predetermined control load state. The host computer 20 causes the actual data to be accumulated in the external storage device 21 as the update process data and evaluates the update process data in accordance with predetermined evaluation standards. Based on results of the evaluation, the recipe parameters for optimizing the process conditions are updated, and the updated recipe parameters are supplied to the main controller 17 as a control command. In response to the control command, the main controller 17 outputs control commands for controlling the process conditions (temperature, concentration, pressure, time, etc.) to the machine controllers 11 to 16.

Figure 3A:
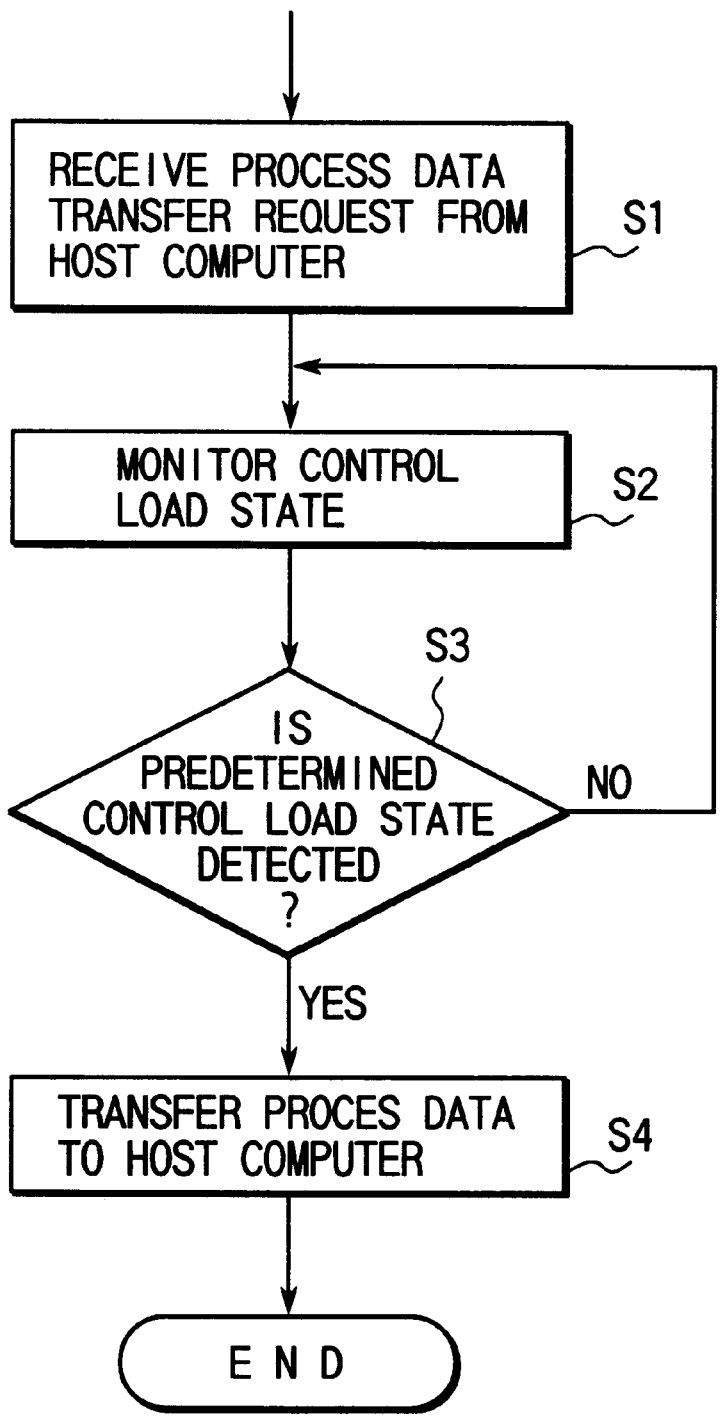
FIG. 3A is a flowchart for explaining transfer of process data to a host computer by a main controller of the process control system shown in FIG. 2.

The transfer of process data from the main controller 17 to the host computer 20 will be described in detail with reference to the flowchart of FIG. 3A and the graph of FIG. 3B.

Upon receiving a process data transfer request from the host computer 20 (step S1), the main controller 17 monitors its own control load state (step S2). When the main controller 17 detects that the control load state is set in a predetermined one (step S3), it transfers the process data accumulated in the storage device 18 to the host computer 20 (step S4).

Here a substantial control no-load state can be quoted as the given control load state described above. In the substantial control no-load state of the main controller 17, no control signals are transferred among the machine controllers 11 to 16. It is however desirable that the control no-load state should be continued for a period of time which is longer than the time required for transferring the process data from the main controller 17 to the host computer 20.

The above control no-load state corresponds to a time period immediately after a series of processes for all wafers in one cassette has been completed in each of the process chambers 1 to 3 and then the cassettes C1 and C2 containing the processed wafers W are discharged from the cassette chambers 4 and 5. The main controller 17 is set in a standby state until a cassette carry-in request is made and thus the time period is desirable for transferring the process data to the host computer 20.

Figure 3B:
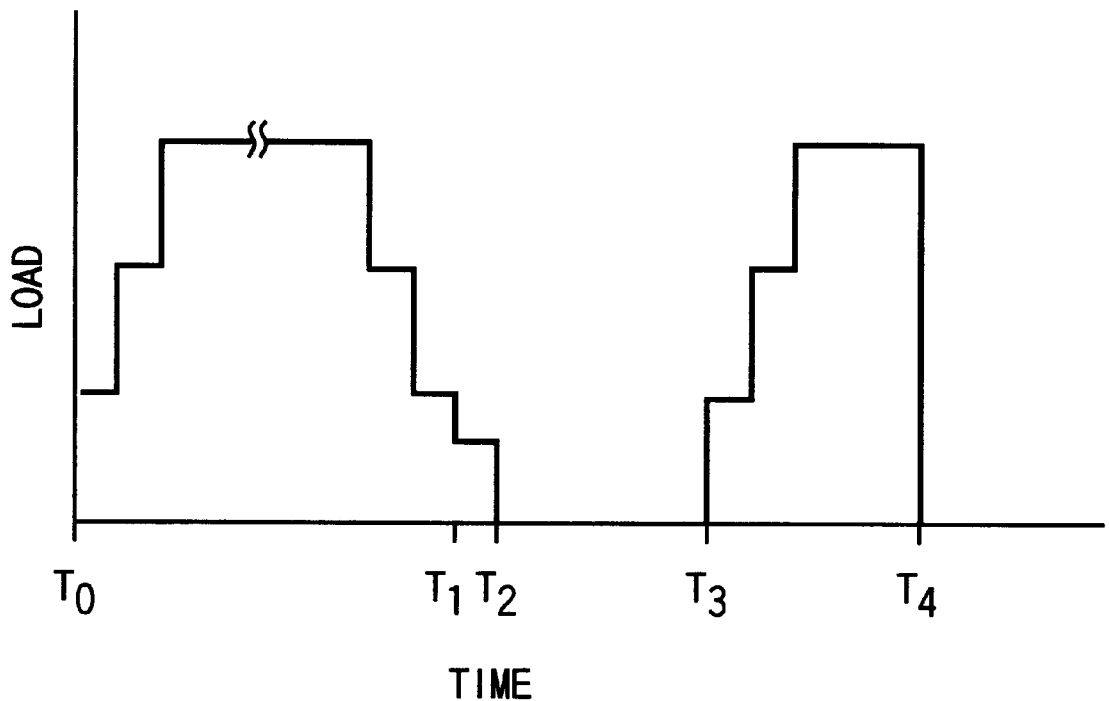
FIG. 3B is a graph showing a relationship between load and time with respect to the transfer of process data shown in FIG. 3A.

More specifically, as illustrated in FIG. 3B, each wafer is subjected to a series of processes in the process chambers 1 to 3, and the processes for all wafers in one cassette are completed during a time period between T0 and T1, while the cassettes C1 and C2 holding the processed wafers W are discharged from the cassette chambers 4 and 5 during a time period between T1 and T2. A time period from T2 to T3 immediately after time T2, is a control no-load period during which the main controller 17 is set in a standby state until the next cassette carry-in request is made. During the time period from T2 to T3, the process data is transferred from the main controller 17 to the host computer 20. In other words, the time period between T2 and T3 is set longer than the time required for the transfer of process data.

At time T3, the processing of wafers in the next cassette is started. If any trouble arises in this processing, the processing is stopped at time T4. After that, the main controller 17 is set in a control no-load state and, in this case, the process data before the stop of the processing is transferred from the main controller 17 to the host computer 20 and stored in the external storage device 21. The process data obtained at the stop of the processing is used to investigate the cause of the stop of the processing.

In the foregoing embodiment, if a wafer W in any of the chambers is not subjected to process control or transfer control and this non-control time period is longer than the time period required for transferring the process data to the host computer 20, the main controller 17 can be set in a substantial control no-load state to transfer the process data to the host computer 20 during the non-control time period.

If the process data is transferred from the main controller 17 to the host computer 20 when the main controller 17 is set in the control no-load state, the total control loads of the main controller 17 can be dispersed on the time basis and the control load for every hour can be averaged more than that in the prior art case. Therefore, for example, the timing of process control can be prevented from being delayed, with the result that the process control can be performed more stably.

In the above embodiment, the process data is transferred to the host computer 20 when the main controller 17 is in a substantial control no-load state. The present invention is not limited to this. The process data can be transferred when the main controller 17 is in a predetermined control low-load state without having an adverse influence upon the process control.

For example, the time period during which the process chambers 1 to 3 and transfer chamber 6 are not controlled but only the other chambers are controlled, can be considered to be within a range of the above control low-load state. Furthermore, the time period during which the process chambers 1 to 3 are not controlled but the other chambers are controlled may be set as the control low-load state. Consequently, a predetermined control low-load state for transferring the process data to the host computer can be selected freely to some extent in accordance with the performance of the main controller 17 and the like.

Adopting the method of transferring the process data to the host computer when the main controller 17 is in the control no-load state, it is needless to say that more stable process control can be achieved.

Figure 4:
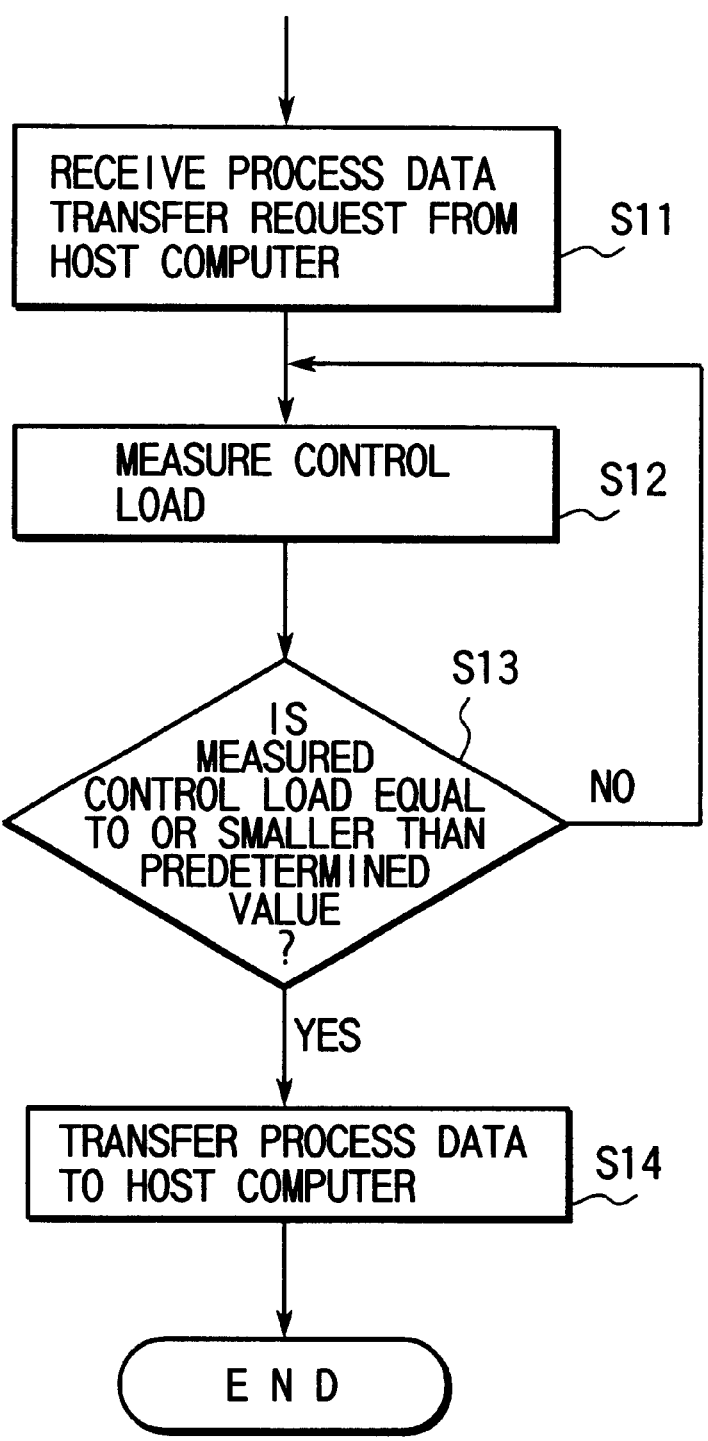
FIG. 4 is a flowchart for explaining transfer of process data to a host computer by a main controller of a process control system according to another embodiment of the present invention.

Moreover, in the above embodiment, the control no-load state and control low-load state are determined by the states of the main controller 17. However, as shown in FIG. 4, the process control system according to the second embodiment of the present invention can be provided with an instrument for measuring a control load of the main controller 17 quantitatively in real time to transfer the process data to the host computer when a value of the measured control load is not more than a set value.

More specifically, when the main controller 17 receives a process data transfer request from the host computer 20 (step S11), it measures a control load to be applied thereto (step S12). Then, the main controller 17 determines whether a value of the measured control load is not more than a predetermined value (step S13). If it is YES, the process data is transferred to the host computer 20 (step S14), and the processing ends. If it is NO, the processing is returned to the step S12.

Since the relationship between the control load value and the set value is changed on the time basis, the process data is transferred to the host computer time-divisionally.

In the first embodiment, the time period of the control no-load state or control low-load state is longer than the time required for transferring the process data to the host computer. However, when such a control no-load state or control low-load state is not necessarily assured, the transfer of process data to the host computer has only to be controlled exclusively from beginning to end.

For example, the transfer of process data to the host computer is started immediately after the cassettes C1 and C2 containing the processed wafers W are discharged from the cassette chambers 4 and 5. In this case, the main controller 17 does not receive a command to carry the next cassettes C1 and C2 in the cassette chambers 4 and 5 before the transfer of the process data is completed; therefore, the main controller 17 has only to receive it after the transfer is completed.

As a third embodiment of the present invention, process data can be transferred from the main controller 17 to the host computer 20 in accordance with a preset arbitrary timing in which the process data does not influence the process (e.g. a timing in which the control no-load state and control low-load state is set after processing).

Figure 5:
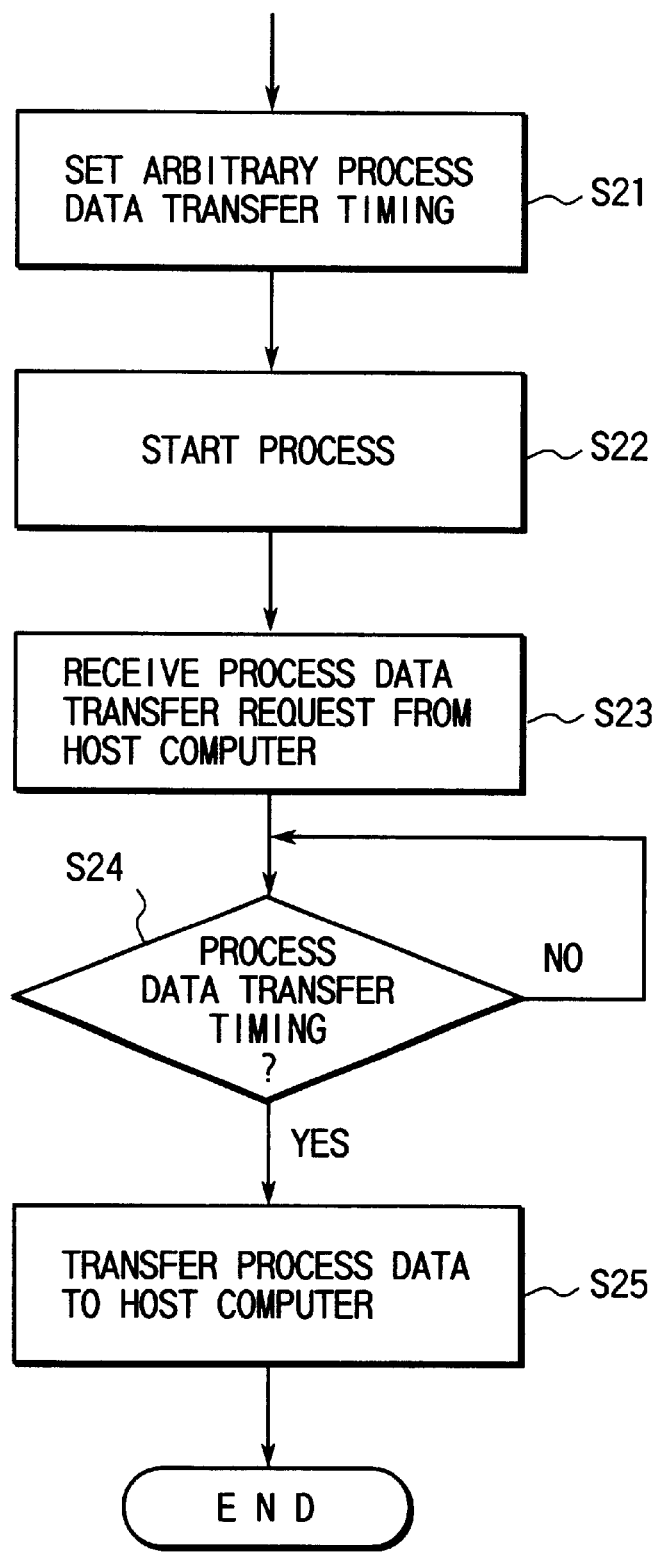
FIG. 5 is a flowchart for explaining transfer of process data to a host computer by a main controller of a process control system according to still another embodiment of the present invention.

In the third embodiment, as shown in FIG. 5, an arbitrary process data transfer timing, which does not influence a process, is set before the execution of the process (step S21). This timing can be determined by setting the parameter of control programs started on the main controller 17 through an MMI (man machine interface), not shown, in the main controller. The MMI is an interface between the machine controllers 11 to 16 and a touch panel display.

After that, the process is started (step S22). The main controller 17 receives a process data request from the host computer 20 (step S23), and it is determined whether the preset timing is the process data transfer timing (step S24). If YES in step S24, the process data accumulated in the storage device 18 is transferred to the host computer 20 (step S25).

If, as described above, the arbitrary timing, which influences no process, is preset and the process data is transferred from the main controller 17 to the host computer 20 in accordance with the timing, the process control and process data transfer control can be prevented from occurring on the time basis at the same time and thus the process control can be assured stably.

In the foregoing embodiments of the present invention, the process control system is applied to the semiconductor wafer processing apparatus. However, the present invention is not limited to this. For example it can be applied to an apparatus for processing various types of substrates such as a glass substrate and an LCD substrate.

According to the present invention as described above, when the main controller for controlling the machine controllers for individually controlling the chambers is set in a predetermined control load state, e.g., a predetermined control no-load state or control low-load state, the accumulated process data is transferred to the outside (host computer). Therefore, the total control loads of the main controller can be dispersed on the time basis and the control load for every hour can be averaged more than that in the prior art case. Therefore, for example, the timing of process control can be prevented from being delayed and accordingly the process control can be performed more stably.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A process control system comprising:
 a plurality of first controllers for individually controlling a plurality of process chambers; and a second controller for controlling said plurality of first controllers, and wherein each of said plurality of first controllers includes first transferring means for transferring process data detected by a corresponding process chamber to said second controller, and said second controller includes accumulating means for accumulating process data transferred from said plurality of first controllers to obtain accumulated process data therein, second transferring means for transferring the accumulated process data to an outside, measuring means for measuring a control load quantitatively in real time, and transfer control means for causing the second transferring means to externally transfer the accumulated process data when the control load measured by the measuring means has a value which is not more than a set value.

2. The process control system according to claim 1, wherein said second transferring means of said second controller transfers the accumulated process data to the outside when said second controller is set in a substantial control no-load state.

3. The process control system according to claim 2, wherein said second controller includes means for detecting a control low-load state, which controls some of the plurality of process chambers through said plurality of first controllers, as the substantial control no-load state.

4. The process control system according to claim 1, wherein said second controller includes means for setting a control no-load state, which continues for a longer time than a time required for transferring the accumulated process data externally from said second controller, as the substantial control load state.

5. The process control system according to claim 1, wherein said transfer control means of said second controller causes said transferring means to exclusively transfer the process data until transfer of the process data is completed.

6. The process control system according to claim 1, wherein said transfer control means of said second controller causes said transferring means to transfer the process data to the outside at a predetermined timing.

7. A process control system comprising:

a plurality of first controllers for individually controlling a plurality of process chambers; and a second controller for controlling said plurality of first controllers, and wherein each of said plurality of first controllers includes means for transferring process data detected by a corresponding one of said process chambers to said second controller, and said second controller includes means for accumulating process data transferred from said plurality of first controllers to obtain accumulated process data, means for measuring a control load imposed on said second controller to obtain measured control load, and means for transferring the accumulated process data to an outside when the measured control load corresponds to at least one of a time period immediately after a series of process for all wafers in one cassette has been completed, a standby state until a cassette carry-in request is made, and a time when said system is interrupted due to an operation error.

8. The process control system according to claim 7, wherein said second controller further includes means for inhibiting an interrupt from outside while the accumulated process data is transferred to the outside.

9. A process control system comprising:

a plurality of first controllers for individually controlling a plurality of process chambers; and a second controller for controlling said plurality of first controllers, and wherein each of said plurality of first controllers includes means for transferring process data detected by a corresponding one of said process chambers to said second controller, and said second controller includes means for accumulating process data transferred from said plurality of first controllers to obtain accumulated process data, setting means for setting an arbitrary timing at which the accumulated process data is transferred to an outside, the arbitrary timing corresponding to least one of a time period immediately after a series of processes for all wafers in one cassette has been completed, a standby state until a cassette carry-in request is made, and a time when said system is interrupted due to an operation error, and means for transferring the accumulated process data to the outside in accordance with the set timing.

10. The process control system according to claim 9, wherein said second controller further includes means for inhibiting an interrupt from outside while the process data is transferred to the outside.

11. A method of transferring process data, comprising the steps of:

individually controlling a plurality of process chambers by a plurality of first controllers;

controlling said plurality of first controllers by a second controller;

transferring process data detected by said plurality of process chambers to said second controller;

accumulating the transferred process data in storage means; and transferring the accumulated process data to an outside when a control load detected by said second controller is not more than a predetermined value.

12. The method according to claim 11, wherein said step of transferring the accumulated process data to the outside includes a step of transferring the accumulated process data to the outside when said second controller is in a predetermined control no-load state.

13. The method according to claim 11, wherein said step of transferring the accumulated process data to the outside includes a step of transferring the accumulated process data to the outside in accordance with preset arbitrary timing corresponding to at least one of a time period immediately after a series of processes for all wafers in one cassette has been completed, a standby state until a cassette carry-in request is made, and an interruption due to an operation error.

14. A method of transferring process data, comprising the steps of:

individually controlling a plurality of process chambers by a plurality of first controllers;

controlling said plurality of first controllers by a second controller;

transferring process data detected by said plurality of process chambers to said second controller;

accumulating the transferred process data to obtain accumulated process data;

measuring a control load imposed to said second controller to obtain a measured control load; and transferring the accumulated process data to an outside when the measured control load corresponds to at least one of a time period immediately after a series of processes for all wafers in one cassette has been completed, a standby state until a cassette carry-in request is made, and a time when said system is interrupted due to an operation error.

15. A process control system comprising:

a plurality of first controllers configured to individually control a plurality of process chambers; and a second controller configured to control said plurality of first controllers, and wherein each of said plurality of first controllers includes a first transferring unit configured to transfer process data detected by a corresponding one of said process chambers to said second controller, and said second controller includes an accumulating unit configured to accumulate process data transferred from said plurality of first controllers to obtain accumulated process data therein, a second transferring unit configured to transfer the accumulated process data to an outside, a measuring unit configured to measure a control load quantitatively in real time, and a transfer control unit configured to cause said second transferring unit to externally transfer the accumulated process data when the control load measured by the measuring means has a value which is not more than a set value.

16. A process control system comprising:

a plurality of first controllers configured to individually control a plurality of process chambers; and a second controller configured to control said plurality of first controllers, and wherein each of said plurality of first controllers includes a first transferring unit configured to transfer process data detected by a corresponding one of said process chambers to said second controller, and said second controller includes an accumulating unit configured to accumulate process data transferred from said plurality of first controllers to obtain accumulated process data, a measuring unit configured to measure a control load imposed to said second controller to obtain a measured control load, and a second transferring unit configured to transfer the accumulated process data to an outside when the measured control load corresponds to at least one of a time period immediately after a series of processes for all wafers in one cassette has been completed, a standby state until a cassette carry-in request is made, and a time when said system is interrupted due to an operation error.

17. A process control system comprising:

a plurality of first controllers configured to individually control a plurality of process chambers; and a second controller configured to control said plurality of first controllers, and wherein each of said plurality of first controllers includes a first transferring unit configured to transfer process data detected by a corresponding one of said process chambers to said second controller, and said second controller includes an accumulating unit configured to accumulate process data transferred from said plurality of first controllers to obtain accumulated process data, a setting unit configured to set an arbitrary timing in which the accumulated process data is transferred to an outside, the arbitrary timing corresponding to at least one of a time period immediately after a series of processes for all wafers in one cassette has been completed, a standby state until a cassette carry-in request is made, and a time when said system is interrupted due to an operation error, and a second transferring unit configured to transfer the accumulated process data to the outside in accordance with the set timing.

* * * * *